(12) United States Patent
Brandenburg et al.

(10) Patent No.: US 6,285,551 B1
(45) Date of Patent: Sep. 4, 2001

(54) OVERMOLDED ELECTRONIC ASSEMBLY

(75) Inventors: Scott David Brandenburg; Mark Anthony Koors; Jeffery Ralph Daanen, all of Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/692,241

(22) Filed: Oct. 20, 2000

Related U.S. Application Data

(62) Division of application No. 09/081,498, filed on May 20, 1998.

(51) Int. Cl.$^7$ ...................................................... H05K 7/20
(52) U.S. Cl. .......................... 361/704; 361/702; 361/723; 361/733; 257/706; 257/712; 165/185
(58) Field of Search ..................................... 361/700–712, 361/717–723, 252–756, 688–690, 802, 733–734; 257/686, 688, 692, 695, 693, 694, 706, 707, 712, 717–719, 787, 796, 776; 307/72, 73, 70, 74, 80; 165/80.3, 185; 439/485

(56) References Cited

U.S. PATENT DOCUMENTS

| | | | |
|---|---|---|---|
| 4,868,638 | 9/1989 | Hirata et al. | 357/72 |
| 5,444,909 | 8/1995 | Mehr | 29/827 |
| 5,570,272 | 10/1996 | Variot | 361/723 |
| 5,625,226 | * 4/1997 | Kinzer | 257/705 |
| 5,722,161 | 3/1998 | Marrs | 29/841 |
| 5,774,342 | * 6/1998 | Branderburg et al. | 361/774 |
| 5,935,502 | 8/1999 | Ferri et al. | 264/272.15 |

\* cited by examiner

*Primary Examiner*—Gerald Tolin
*Assistant Examiner*—Michael Datskovsky
(74) *Attorney, Agent, or Firm*—Jimmy L. Funke

(57) ABSTRACT

An overmolded electronic assembly (10) and method for forming the assembly (1) that entails enclosing a circuit board (12) having one or more circuit devices (16) mounted to its surface. The assembly (10) includes a heat-conductive member (18) in thermal contact with one or more of the circuit devices (16) mounted to the circuit board (12). An overmolded body (22) encloses the circuit board (12) and the circuit devices (16) with the heat-conductive member (18), such that the overmolded body (22) and heat-conductive member (18) form a moisture-impermeable seal around the circuit board (12) and circuit devices (16). The overmolded body (22) also includes a connector housing (28) integrally-formed in its outer surface. The method for manufacturing the overmolded electronic assembly (10) generally entails supporting the circuit board (12) with the heat-conductive member (18) such that the heat-conductive member (18) thermally contacts the circuit devices (16). An overmolded enclosure is then formed by molding a material over the surface of the circuit board (12) to form the overmolded body (22) that, with the heat-conductive member (18), encases the circuit board (12) and its circuit devices (16).

10 Claims, 2 Drawing Sheets

OVERMOLDED ELECTRONIC ASSEMBLY

This is a division of application Ser. No. 09/081,498 filed on May 20, 1998.

FIELD OF THE INVENTION

The present invention generally relates to electronic assemblies. More particularly, this invention relates to an overmolded electronic assembly that is compatible with automated assembly methods and yields an enclosure of the type that conducts heat away from a flip chip or other circuit device enclosed within the assembly.

BACKGROUND OF THE INVENTION

Circuit boards with semiconductor devices such as flip chips must often be protected from the environment in which the board is employed. A widely practiced method is to enclose such circuit boards in an assembly that includes a pair of case halves that must be assembled together by hand to form an enclosure that supports the circuit board within. Connectors secured to one of the case halves provide for electrical interconnection to the circuit board. Sealing elements are also typically required to exclude moisture from the enclosure. Finally, fasteners are required to secure the assembly together. Such assembly processes are labor intensive, and the resulting package must be tested for leakage to ensure the package was properly assembled.

From the above, it can be appreciated that a less complicated assembly process for electronic assemblies would be highly desirable from the standpoint of a labor, material and process costs, as well as reliability.

SUMMARY OF THE INVENTION

According to the present invention, there is provided an overmolded electronic assembly and a method for forming the assembly that entails enclosing a circuit board having one or more circuit devices mounted to its surface. The assembly includes a heat-conductive member in thermal contact with one or more of the circuit devices mounted to the circuit board. An overmolded body encloses the circuit board and the circuit device with the heat-conductive member, such that the overmolded body and heat-conductive member form a moisture-impermeable seal around the circuit board and circuit device. The overmolded body also has a connector housing integrally-formed in its outer surface. The method for manufacturing the overmolded electronic assembly generally entails supporting the circuit board on the heat-conductive member such that the heat-conductive member thermally contacts the circuit device. An overmolded enclosure is then formed by molding a material over the surface of the circuit board to form the overmolded body that, with the heat-conductive member, encloses the circuit board and its circuit device.

In a preferred aspect of the invention, the heat-conductive member includes pedestals that contact the circuit devices, supports space the circuit board from the heat-conductive member, and the circuit board has input/output pins that extend through the overmolded body and into the connector housing. In this manner, the circuit board, supports and heat-conductive member define a cavity into which the material for the overmolded enclosure flows during molding to encase the circuit board. In one embodiment of the invention, the assembly further includes a snap-fit member that is mechanically locked to the heat-conductive member, with the circuit board being enclosed between the snap-fit member and the heat-conductive member. The snap-fit member preferably biases the circuit device against the heat-conductive member, and provides EMI shielding for the circuit board. The overmolded body is formed by molding a material over the exterior surface of the snap-fit member, such that the overmolded body and heat-conductive member enclose and encase the circuit board and snap-fit member.

From the above, one can see that the overmolded electronic assembly of this invention provides an uncomplicated method for encasing a circuit board and its circuit devices in a protective enclosure. More particularly, the assembly eliminates the prior art requirement for separate connectors, individual case assemblies, fasteners and seals. In the manufacturing process, there is no assembly of seals to case halves, no fastening of case halves, reduced inventory of parts and no leak test requirement. Furthermore, the electronic assembly can be manufactured on a completely automated final assembly line. Finally, the electronic assembly can exhibit improved heat transfer from the circuit devices, resistance to vibration and shock, and improved reliability due to more closely matched coefficients of thermal expansion (CTE) of the overmolding and circuit board materials.

Other objects and advantages of this invention will be better appreciated from the following detailed description.

BRIEF DESCRIPTION OF THE DRAWINGS

The present invention will now be described, by way of example, with reference to the accompanying Figures, in which.

DETAILED DESCRIPTION OF THE INVENTION

Figure 1:
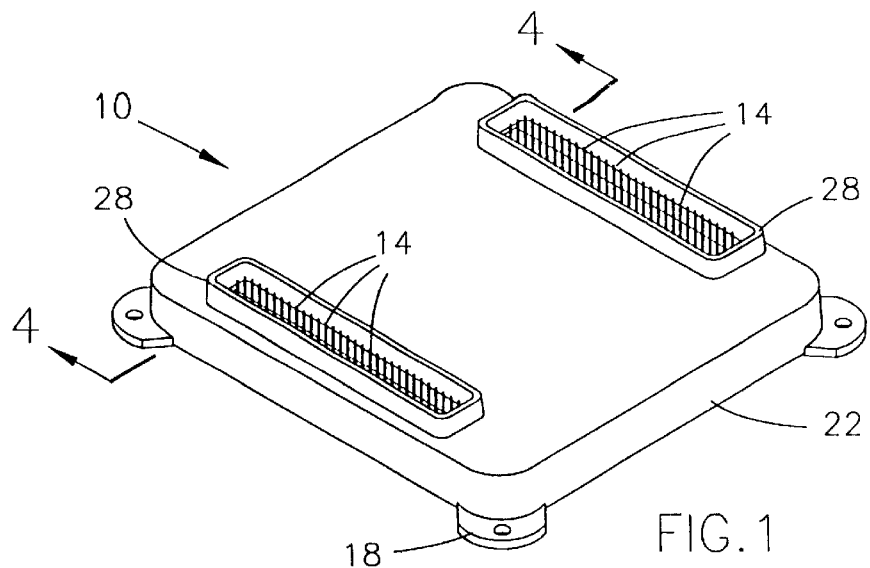
FIG. 1 shows an overmolded electronic assembly in accordance with a first embodiment of this invention.
Figure 2:
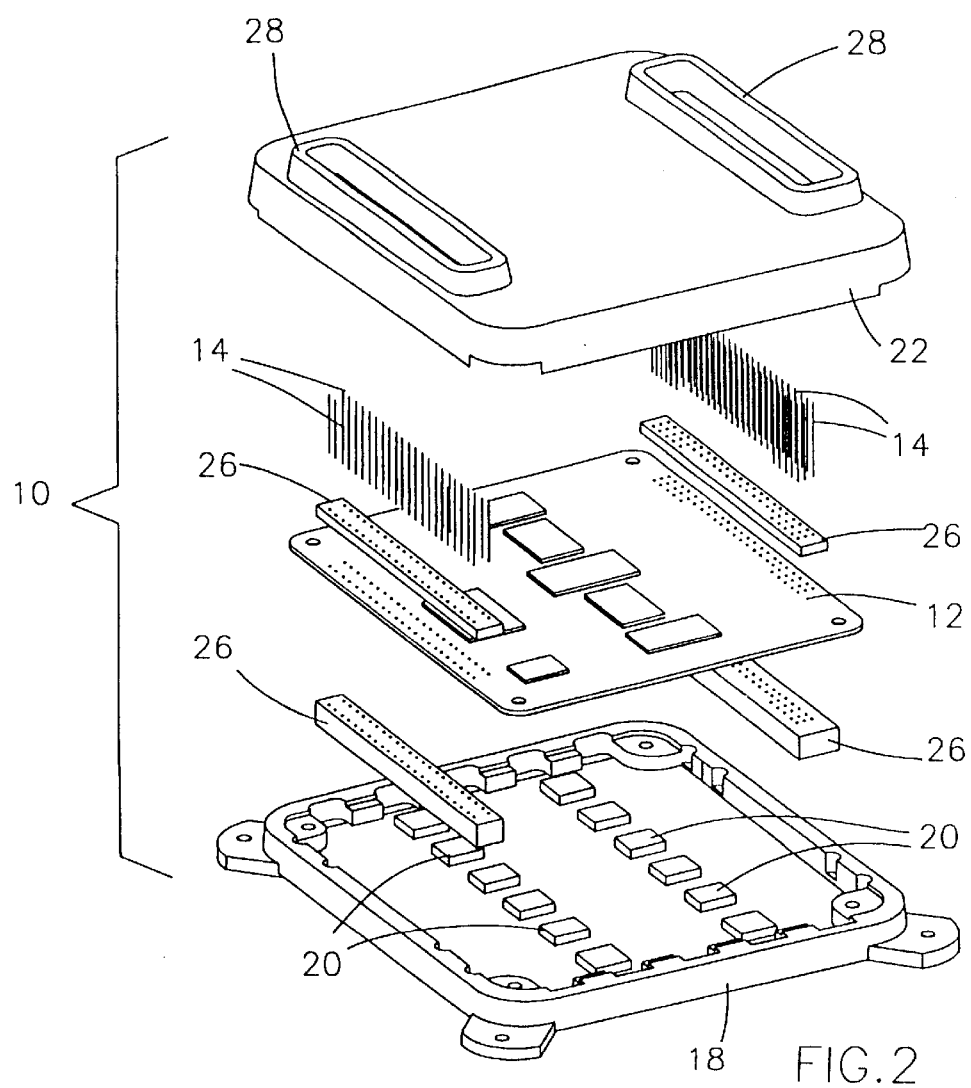
FIG. 2 is an exploded view of the overmolded electronic assembly of FIG. 1.
Figure 4:
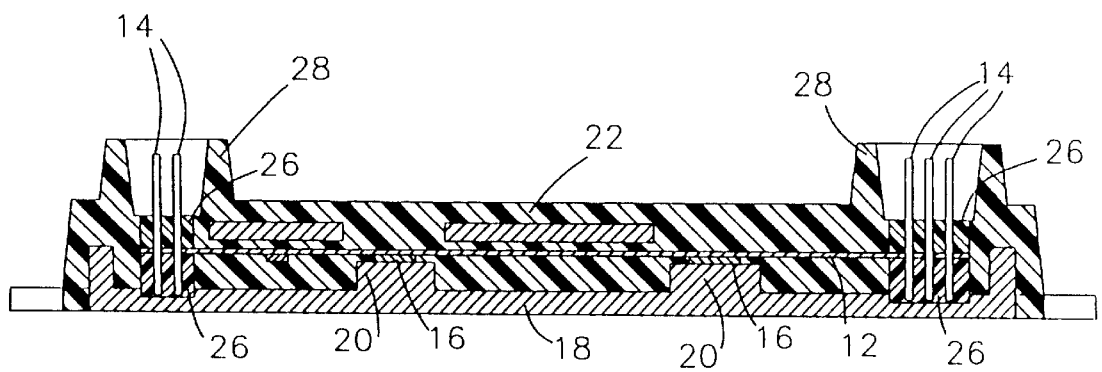
FIG. 4 is a cross-sectional view of the overmolded electronic assembly of FIG. 1.

FIGS. 1, 2 and 4 show an overmolded electronic assembly 10 enclosing a circuit board 12 in accordance with a first embodiment of this invention. The circuit board 12 may be a thin laminate, printed wiring board (PWB), or any other material known in the art. Shown mounted to one surface of the circuit board 12 in FIG. 4 are several IC packages 16 that dissipate heat. The packages 16 will typically be flip chips, though the invention is applicable to essentially any surface-mount device. The circuit board 12 includes I/O (input/output) connector pins 14 electrically interconnected with the IC packages 16 in any suitable manner. In addition to the circuit board 12, the assembly 10 includes a heatsink 18 formed of a thermally conductive material, such as a metal or a metal-filled plastic. The heatsink 18 has a number of pedestals 20 in thermal contact with the IC packages 16, such that heat is conducted from the packages 16 and into the heatsink 18 for subsequent dissipation to the surrounding environment.

An overmolded housing 22 encases the circuit board 12, contacting the upper surface of the circuit board 12 (opposite the IC packages 16) and underfilling the circuit board 12, and therefore contacting the heatsink 18 and the lower surface of the board 12. In this manner, the overmolded housing 22 forms a moisture-impermeable seal around the circuit board 12 and its IC packages 16, as best seen in FIG. 4. The overmolded housing 22 includes a pair of integrally-formed connector housings 28 into which the pins 14 project, such that the pins 14 and connector housings 28 form a pair of connectors on the exterior of the electronic assembly 10.

To produce the electronic assembly 10 shown in FIGS. 1, 2 and 4, the circuit board 12 is preferably preassembled with the pins 14 and dielectric pin retainers 26, with a pair of the retainers 26 being positioned on each side of the circuit board 12. With the configuration shown, the pins 14 extend through the retainers 26 on the upper surface of the circuit board 12, through the circuit board 12, and into the retainers 26 on the lower surface of the circuit board 12, such that the pins 14 project above the surface of the upper pair of retainers 26 as shown. The circuit board 12 is then placed on the heatsink 18 such that the heatsink 18, and particularly the pedestals 20, thermally contact the IC packages 16. The lower pin retainers 26 support and space the circuit board 12 above the heatsink 18.

The overmolded housing 22 is then molded in-situ by molding a suitable dielectric material over the subassembly formed by the circuit board 12 and heatsink 18. During molding, the material for the housing 22 flows over, around and under the circuit board 12 to encase the board 12. In this manner, the heatsink 18, pin retainers 26 and circuit board 12 are insert-molded within the tooling in which the housing 22 is formed. The upper pin retainers 26 support the tooling during molding of the housing 22. The tooling is appropriately configured to integrally form the connector housings 28 in the appropriate location on the overmolded housing 22, forming electrical connectors with the pins 14 that protrude through the housing 22. Suitable materials for the housing 22 include those used to form the IC packages, though it is foreseeable that other moldable dielectric materials could be used.

Figure 3:
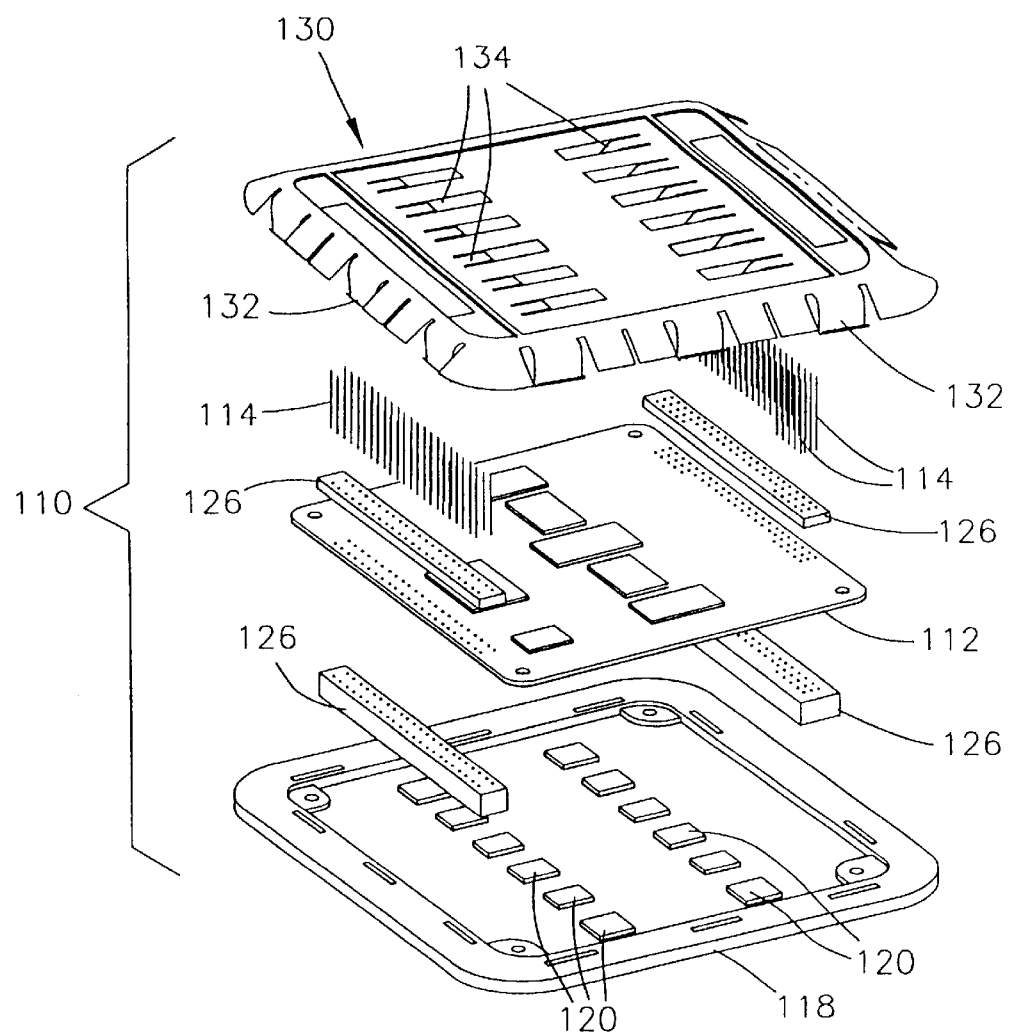
FIG. 3 shows an overmolded electronic assembly in accordance with a second embodiment of this invention.

In a second embodiment shown in FIG. 3, an electronic assembly 110 is formed similarly to the assembly 10 of FIGS. 1, 2 and 4, but further includes a snap-fit retainer 130 that is also insert-molded during overmolding of a housing 122. Similar to the first embodiment, the assembly 110 includes a circuit board 12 with connector pins 14, IC packages (not shown) and pin retainers 126, a heatsink 118 with pedestals 120, and the overmolded housing 122. The retainer 130 is preferably formed from a metal or other electrically-conductive material, such that the retainer 1S0 provides EMT shielding of the IC packages.

As shown in FIG. 3, the retainer 130 includes integrally-formed locking appendages 132 that interlock with the heatsink 118, and biasing members 134 that apply pressure to the near surface of the circuit board 112 to promote thermal contact between the IC packages and the pedestals 120 on the heatsink 118. The locking appendages 132 and biasing members 134 can be any suitable elements, such as the resilient cantilevered springs shown in FIG. 3. Locking appendages 132 and biasing members 134 of this type can be readily formed when the retainer 130 is fabricated by stamping. However, it is foreseeable that other elements could be used for these purposes, such as elastomeric pads located on the lower surface of the retainer 120 to contact the circuit board 112.

The process for assembling the electronic assembly 110 of FIG. 3 is similar to that for the assembly 10 of FIGS. 1, 2 and 4, but with the retainer 130 being mounted to the subassembly formed by the circuit board 12 and heatsink 118 prior to overmolding the housing 122. In this manner, the circuit board 112 is enclosed between the retainer 130 and the heatsink 118. The material for the overmolded housing 122 is then molded directly over the retainer 130, such that the housing 122 directly contacts and covers the retainer 130, as well as the dielectric pin retainers 126, the circuit board 12 and the heatsink 118.

While our invention has been described in terms of a preferred embodiment, it is apparent that other forms could be adopted by one skilled in the art.

For example, it is not necessary that the pins 14 and 114 extend through the pin retainers 26 and 126. Instead, the pins 14 and 114 could be mounted to the circuit board 12 in any suitable fashion, with the role of the retainers 26 and 126 being limited to the purpose of appropriately spacing the circuit board 12 from the heatsink 18 and supporting the tooling during the molding operation. Accordingly, the scope of our invention is to be limited only by the following claims.

What is claimed is:

1. An assembly comprising:

a circuit board having a first surface, an oppositely-disposed second surface, and a circuit device mounted to the second surface;

a heat-conductive member thermally and physically contacting the circuit device; and an overmolded body enclosing the circuit board and the circuit device with the heat-conductive member, the overmolded body and heat-conductive member providing a moisture-impermeable seal around the circuit board and the circuit device, the overmolded body having an external surface in which is integrally-formed a connector housing.

2. An assembly as recited in claim 1, wherein the heat-conductive member comprises pedestals that contact the circuit device.

3. An assembly as recited in claim 1, further comprising supports spacing the circuit board from the heat-conductive member.

4. An assembly as recited in claim 1, wherein the circuit board has input/output pins that extend through the overmolded body and into the connector housing of the overmolded body, the connector housing and the input/output pins providing for electrical connection to the circuit device.

5. An assembly as recited in claim 4, further comprising dielectric supports that surround the input/output pins and space the circuit board from the heat-conductive member.

6. An assembly as recited in claim 5, wherein the overmolded body contacts and covers the first and second surfaces of the circuit board and encases the circuit board, the dielectric supports and the circuit device.

7. An assembly as recited in claim 1, further comprising a snap-fit member mechanically locked to the heat-conductive member with an integrally-formed resilient appendage, the circuit board being enclosed between the snap-fit member and the heat-conductive member.

8. An assembly as recited in claim 7, wherein the snap-fit member comprises means for biasing the circuit device against the heat-conductive member.

9. An assembly as recited in claim 8, wherein the biasing means is a second integrally-formed resilient appendage of the snap-fit member.

10. An assembly as recited in claim 7, wherein the snap-fit member is a metallic EMI shield.

* * * * *